US008666692B2

(12) United States Patent
Mizuno et al.

(10) Patent No.: US 8,666,692 B2
(45) Date of Patent: Mar. 4, 2014

(54) METHOD OF ESTIMATING CURIE TEMPERATURE DISTRIBUTION IN A MAGNETIC RECORDING LAYER

(75) Inventors: Tomohito Mizuno, Tokyo (JP); Koji Shimazawa, Tokyo (JP); Hiroshi Kiyono, Tokyo (JP)

(73) Assignee: TDK Corporation, Tokyo (JP)

( * ) Notice: Subject to any disclaimer, the term of this patent is extended or adjusted under 35 U.S.C. 154(b) by 333 days.

(21) Appl. No.: 13/044,976

(22) Filed: Mar. 10, 2011

(65) Prior Publication Data

US 2012/0232831 A1   Sep. 13, 2012

(51) Int. Cl.
*G06F 17/18*   (2006.01)

(52) U.S. Cl.
USPC ............................................ 702/130; 360/59

(58) Field of Classification Search
USPC ............. 369/13.33; 148/108, 511; 156/272.2, 156/712; 324/231, 223, 754.19, 100, 252; 374/163, 176, 45, 137; 428/826–830; 702/99, 130
See application file for complete search history.

(56) References Cited

U.S. PATENT DOCUMENTS

| | | | | |
|---|---|---|---|---|
| 6,746,749 B2* | 6/2004 | Kirino et al. | .................. | 428/832 |
| 7,678,476 B2* | 3/2010 | Weller et al. | ................ | 428/828.1 |
| 7,678,479 B2* | 3/2010 | McLean et al. | ................ | 429/483 |
| 2004/0107426 A1* | 6/2004 | Sato et al. | ........................ | 720/618 |
| 2005/0283839 A1* | 12/2005 | Cowburn | ......................... | 726/26 |
| 2006/0181799 A1* | 8/2006 | Inomata | ........................... | 360/59 |
| 2008/0043359 A1* | 2/2008 | Chung et al. | .................... | 360/59 |
| 2009/0040644 A1* | 2/2009 | Lu et al. | ........................... | 360/59 |
| 2009/0068500 A1* | 3/2009 | Kong et al. | ................ | 428/846.6 |

OTHER PUBLICATIONS

Tagawa, I, et al., "Relationship Between High Density Recording Performance and Particle Coercivity Distribution," *IEEE Transactions on Magnetics*, Nov. 1991, pp. 4975-4977, vol. 27, No. 6.

* cited by examiner

*Primary Examiner* — Sujoy Kundu
*Assistant Examiner* — Corey Bailey
(74) *Attorney, Agent, or Firm* — Oliff PLC

(57) ABSTRACT

In exemplary embodiments, first and second parameters are obtained for each of different temperatures of the magnetic recording layer. The absolute value of the first parameter for each magnetic grain has a minimum value when the temperature of each magnetic grain reaches a predetermined temperature that increases as the Curie temperature increases, and decreases as the Curie temperature decreases. The second parameter is related to the standard deviation of the coercivity distribution of the magnetic grains divided by the coercivity of the magnetic recording layer. The method calculates a value where the absolute measurement value of the first parameter has a minimum value and the temperature of the magnetic recording layer at which the standard deviation of the coercivity distribution of the magnetic grains divided by the coercivity of the magnetic recording layer has a maximum value.

2 Claims, 5 Drawing Sheets

METHOD OF ESTIMATING CURIE TEMPERATURE DISTRIBUTION IN A MAGNETIC RECORDING LAYER

FIELD OF THE INVENTION

The present invention relates to a method of estimating the Curie temperature distribution of a plurality of magnetic grains contained in a magnetic recording layer.

DESCRIPTION OF THE RELATED ART

Recently, magnetic recording apparatuses such as magnetic disk drives have been improved in recording density, and thin-film magnetic heads and recording media of improved performance have been demanded accordingly. Among the thin-film magnetic heads, a composite thin-film magnetic head has been used widely. The composite thin-film magnetic head has such a structure that a read head including a magnetoresistive element (hereinafter, also referred to as MR element) for reading and a write head including an induction-type electromagnetic transducer for writing are stacked on a substrate. In a magnetic disk drive, the thin-film magnetic head is mounted on a slider that flies slightly above the surface of the recording medium.

A recording medium in a magnetic recording apparatus has a magnetic recording layer made of an aggregate of many microscopic magnetic grains. Each magnetic grain has a single-domain structure. A single recording bit of the recording medium is composed of a plurality of magnetic grains. For improved recording density, it is necessary to reduce asperities at the borders between adjoining recording bits. To achieve this, the magnetic grains must be made smaller. However, making the magnetic grains smaller causes the problem that the thermal stability of magnetization of the magnetic grains decreases with decreasing volume of the magnetic grains. To solve this problem, it is effective to increase the anisotropic energy of the magnetic grains. However, increasing the anisotropic energy of the magnetic grains leads to an increase in coercivity of the magnetic recording layer, and this makes it difficult to perform data recording with existing magnetic heads.

To solve the aforementioned problems, there has been proposed a technology so-called thermally-assisted magnetic recording. The technology uses a recording medium having a magnetic recording layer of high coercivity. When recording data, a magnetic field and heat are simultaneously applied to an area of the magnetic recording layer where to record data, so that the area rises in temperature and drops in coercivity for data recording.

In conventional recording methods using only magnetism, contributive factors to an increase in linear recording density have been dominated mainly by a large gradient of change in write magnetic field in the track direction. In addition to this, for thermally-assisted magnetic recording, a change in temperature occurring in the magnetic recording layer in the track direction due to the heat applied to the recording medium and a change in coercivity occurring in the magnetic recording layer in the track direction due to the aforementioned temperature change are also contributive factors to an increase in linear recording density. Thermally-assisted magnetic recording is therefore considered to be highly effective in increasing the linear recording density.

On the other hand, to reduce the magnetic transition width in a recording medium used for thermally-assisted magnetic recording, it is ideal for a plurality of magnetic grains contained in the magnetic recording layer to have an equal coercivity at the same temperature. However, in actual recording media, the magnetic grains contained in the magnetic recording layer have different coercivities at the same temperature. Large variations in coercivity would probably lead to an increased magnetic transition width.

One of the causes for variations in coercivity mentioned above is thought to be variations in the Curie temperatures of the plurality of magnetic grains contained in the magnetic recording layer. The size of the Curie temperature distribution of the plurality of magnetic grains can affect the condition settings for the recording operation of the magnetic recording apparatus and/or the quality of recording media. It is thus conceivable that a properly estimated result of the Curie temperature distribution of a plurality of magnetic grains could be usable for condition settings of appropriate recording operations, designing of recording media, quality control during manufacturing of recording media, and so on.

A method of estimating the extent of a coercivity distribution of a plurality of magnetic grains contained in a recording medium is disclosed in Literature "I. TAGAWA and Y. NAKAMURA; IEEE Transactions on Magnetics, Vol. 27, No. 6, November, 1991, p. 4975-4977" (hereinafter referred to as Literature "TAGAWA and NAKAMURA"). However, no method has been provided for properly estimating the Curie temperature distribution of a plurality of magnetic grains contained in a magnetic recording layer.

OBJECT AND SUMMARY OF THE INVENTION

It is an object of the present invention to provide a method of estimating the Curie temperature distribution of a plurality of magnetic grains contained in a magnetic recording layer.

A method of estimating a Curie temperature distribution in a magnetic recording layer according to the present invention estimates the distribution of the Curie temperatures of a plurality of magnetic grains that are contained in a magnetic recording layer. The method includes first to third steps. In the first step, a measurement value of a first parameter is obtained with the magnetic recording layer used as a measurement subject, for each of different temperatures of the magnetic recording layer by changing the temperature of the magnetic recording layer. The first parameter has such a property that the absolute value of the first parameter for each magnetic grain takes on the minimum value when the temperature of each magnetic grain reaches a predetermined temperature in the process of increasing the temperature of each magnetic grain. Here, the predetermined temperature varies according to the Curie temperature of each magnetic grain in such a manner as to increase as the Curie temperature increases, and to decrease as the Curie temperature decreases.

In the second step, a measurement value of a second parameter is obtained with the magnetic recording layer used as the measurement subject, for each of different temperatures of the magnetic recording layer by changing the temperature of the magnetic recording layer. The second parameter is related to a value obtained by dividing the standard deviation of a coercivity distribution of the plurality of magnetic grains by the coercivity of the magnetic recording layer.

In the third step, a value related to the Curie temperature distribution of the plurality of magnetic grains is calculated based on a first temperature and a second temperature. The first temperature is the lowest temperature at which the absolute value of the measurement value of the first parameter takes on the minimum value. The second temperature is the temperature of the magnetic recording layer at which the value obtained by dividing the standard deviation of the coercivity distribution of the plurality of magnetic grains by the coercivity of the magnetic recording layer takes on the maximum value. The second temperature is obtained from the measurement value of the second parameter.

When the temperature of a ferromagnetic material reaches a certain temperature or higher in the process of increasing the temperature of the ferromagnetic material, the magnetism of the ferromagnetic material changes to paramagnetism. This causes the spontaneous magnetization of the ferromagnetic material to disappear as well as the coercivity of the ferromagnetic material to vanish. As used herein, the term "Curie temperature" refers not only to the temperature at which the spontaneous magnetization of a ferromagnetic material disappears in the process of increasing the temperature of the ferromagnetic material but also to the temperature at which the coercivity of the ferromagnetic material disappears in the process of increasing the temperature of the ferromagnetic material.

In the method of the present invention, the minimum of the absolute value of the measurement value of the first parameter may be substantially zero. In the first step, a hysteresis loop of the magnetic recording layer may be determined for each temperature to obtain the measurement value of the first parameter based on the hysteresis loop. In the second step, a hysteresis loop of the magnetic recording layer may be determined for each temperature to obtain the measurement value of the second parameter based on the hysteresis loop.

In the method of the present invention, the first temperature is related to the maximum value of the Curie temperature distribution of the plurality of magnetic grains. The second temperature is related to the minimum value of the Curie temperature distribution of the plurality of magnetic grains. Accordingly, it is possible in the third step to calculate a value related to the Curie temperature distribution of the plurality of magnetic grains based on the first temperature and the second temperature. In this manner, the method of the present invention allows for estimating the Curie temperature distribution of the plurality of magnetic grains contained in the magnetic recording layer, using the value calculated in the third step.

Other and further objects, features and advantages of the present invention will appear more fully from the following description.

DETAILED DESCRIPTION OF THE EMBODIMENTS

A preferred embodiment of the present invention will now be described in detail with reference to the drawings. The embodiment of the invention provides a method of estimating a Curie temperature distribution (hereinafter simply referred to as the estimation method) for use in estimating a recording medium having a magnetic recording layer that contains a plurality of magnetic grains. The estimation method according to the embodiment estimates the distribution of the Curie temperatures of the plurality of magnetic grains contained in the magnetic recording layer. The estimation method according to the embodiment is suitable in particular for estimating a recording medium for thermally-assisted magnetic recording, of which critical problem is variations in the Curie temperatures of the magnetic grains contained in the magnetic recording layer. In this context, the estimation method according to the embodiment will now be described by taking as an example a case where the method is applied to a recording medium for thermally-assisted magnetic recording.

Figure 7:
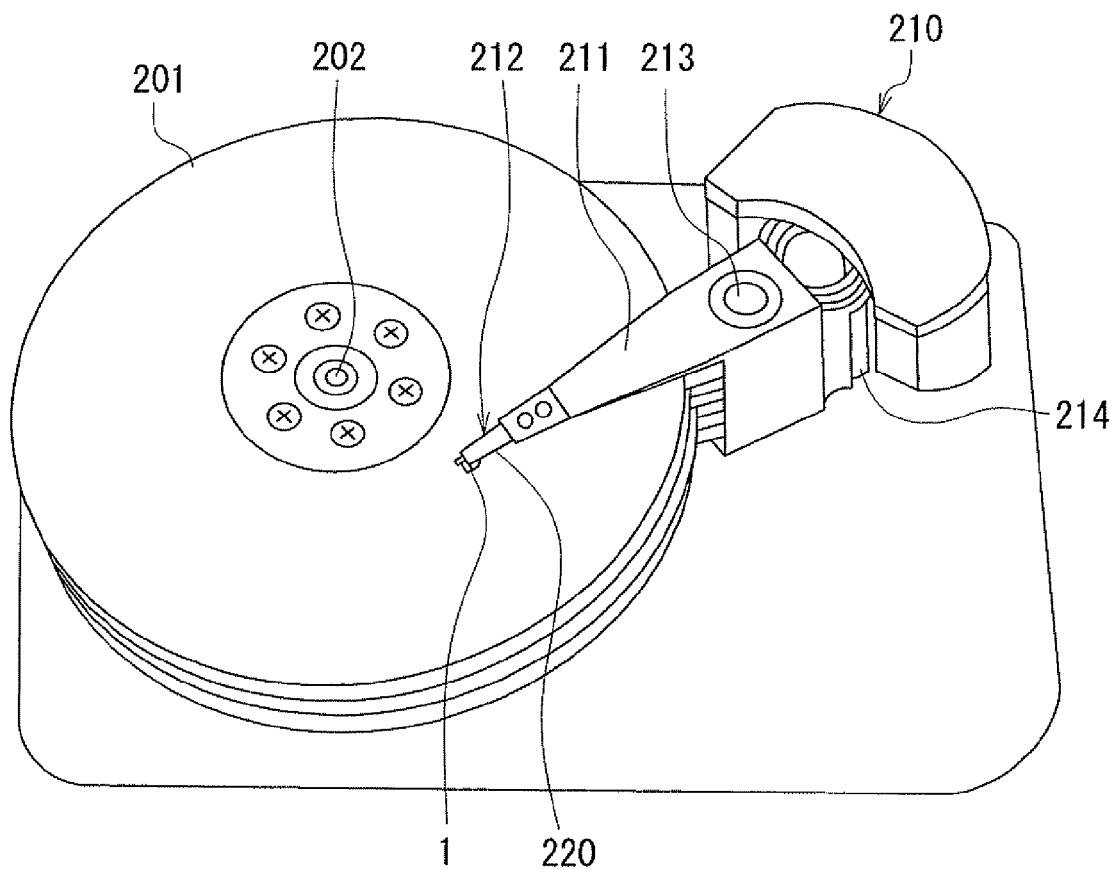
FIG. 7 is a perspective view showing an example of a magnetic recording apparatus that includes a recording medium to which the estimation method according to the embodiment is applicable.

First, with reference to FIG. 7, a description will be given of an example of a magnetic disk drive serving as a magnetic recording apparatus for thermally-assisted magnetic recording. The magnetic disk drive shown in FIG. 7 includes magnetic disks 201 serving as a plurality of recording media, and a spindle motor 202 for rotating the magnetic disks 201. The magnetic disks 201 in this example are intended for recording by means of a perpendicular magnetic recording system in which the signal magnetization is oriented in a direction perpendicular to the plane of the recording medium. Each magnetic disk 201 has a magnetic recording layer containing a plurality of magnetic grains.

The magnetic disk drive further includes an assembly carriage device 210 having a plurality of driving arms 211, and a plurality of head gimbal assemblies 212 attached to respective distal ends of the driving arms 211. Each head gimbal assembly 212 includes a thermally-assisted magnetic recording head 1, and a suspension 220 that supports the thermally-assisted magnetic recording head 1.

The thermally-assisted magnetic recording head 1 includes a read head and a write head. The read head includes an MR element. The write head includes a means for applying a write magnetic field to an area of the magnetic recording layer of the magnetic disk 201 where to record data, and a means for applying heat to that area. The means for applying the write magnetic field includes, for example, a coil that produces a magnetic field corresponding to data to be recorded on the recording medium, and a main pole that passes a magnetic flux corresponding to the magnetic field produced by the coil and produces the write magnetic field for recording the data on the recording medium by means of the perpendicular magnetic recording system. The means for applying heat includes, for example, a near-field light generating element for generating near-field light.

The assembly carriage device 210 is a device for positioning each thermally-assisted magnetic recording head 1 on tracks that are formed in the magnetic recording layer of each magnetic disk 201 and that have recording bits aligned thereon. The assembly carriage device 210 further has a pivot bearing shaft 213 and a voice coil motor 214. The plurality of driving arms 211 are stacked in a direction along the pivot bearing shaft 213 and are pivotable about the shaft 213 by being driven by the voice coil motor 214. Magnetic recording apparatuses that include a recording medium to which the estimation method of the present invention is applicable are not structurally limited to magnetic disk drives having the above-described configuration. For example, the magnetic recording apparatus may be configured to have a single magnetic disk 201, a single driving arm 211, a single head gimbal assembly 212, and a single thermally-assisted magnetic recording head 1.

Figure 8:
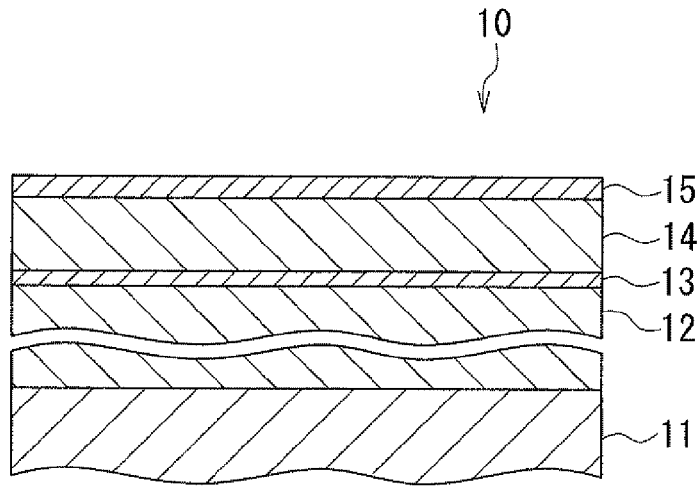
FIG. 8 is a cross-sectional view showing an example of the configuration of a recording medium to which the estimation method according to the embodiment is applicable.

Reference is now made to FIG. 8 to describe an example of the configuration of a recording medium 10 (magnetic disk 201) to which the estimation method according to the embodiment is applicable. The recording medium 10 shown in FIG. 8 includes a substrate 11, and also a soft magnetic layer 12, an orientation layer 13, a magnetic recording layer 14 and a protection layer 15 that are stacked in this order on the substrate 11.

The substrate 11 is made of a nonmagnetic material. The nonmagnetic material to form the substrate 11 may be either a metallic material such as aluminum or a non-metallic material such as glass. The soft magnetic layer 12 is made of a soft magnetic material. The soft magnetic layer 12 functions to pass a write magnetic field supplied from the thermally-assisted magnetic recording head 1 to the recording medium 10 and allow the write magnetic field to flow back to the thermally-assisted magnetic recording head 1. The orientation layer 13 is intended to improve the orientability of the magnetic recording layer 14 to be formed thereon.

The magnetic recording layer 14 has what is called a granular structure. That is, the magnetic recording layer 14 contains a plurality of magnetic grains, each being made up of crystal grains of a ferromagnetic material, and a grain boundary portion made of a nonmagnetic material and separating the plurality of magnetic grains from each other. The magnetic grains are 4 to 10 nm in diameter, for example. The magnetic grains have an easy axis of magnetization oriented in the direction of thickness of the magnetic recording layer 14.

The protection layer 15 is made of a nonmagnetic material. The protection layer 15 functions to protect the magnetic recording layer 14 and prevent damage to the surface of the recording medium 10.

Now, a description will be made on the recording operation and the behavior of the magnetic recording layer 14 when recording data on the recording medium 10 using the thermally-assisted magnetic recording head 1. To record data on the recording medium 10, the thermally-assisted magnetic recording head 1 applies a write magnetic field and heat to an area of the magnetic recording layer 14 while traveling in the track direction relative to the recording medium 10. Accordingly, the area of the magnetic recording layer 14 to which the write magnetic field and heat are applied shifts in the track direction. The temperature of magnetic grains in the path of shift of the area to which the write magnetic field and heat are applied increases from a temperature lower than the Curie temperature. Once the magnetic grains have reached a temperature equal to or higher than the Curie temperature, they return to a temperature lower than the Curie temperature. When the temperature of the magnetic grains has reached a temperature equal to or higher than the Curie temperature, the spontaneous magnetization of the magnetic grains disappears and the coercivity of the magnetic grains turns to be 0 (zero). After that, when the temperature of the magnetic grains decreases to a temperature lower than the Curie temperature, the coercivity of the magnetic grains becomes higher than zero. The coercivity of the magnetic grains increases with decreasing temperature.

In the process in which the coercivity of the magnetic grains increases with decreasing temperature, the direction of magnetization of the magnetic grains can vary in agreement with the direction of the write magnetic field applied to the magnetic grains while the coercivity of the magnetic grains is equal to or smaller than the magnitude of the write magnetic field. When the coercivity of the magnetic grains exceeds the magnitude of the write magnetic field applied to the magnetic grains, the direction of magnetization of the magnetic grains is pinned to the direction of magnetization of the magnetic grains that had been achieved immediately before the coercivity exceeded the magnitude of the write magnetic field.

To reduce the magnetic transition width of the recording medium 10, it is ideal for the plurality of magnetic grains contained in the magnetic recording layer 14 to have the same coercivity at the same temperature. In practice, however, the plurality of magnetic grains contained in the magnetic recording layer 14 of the recording medium 10 vary in coercivity at the same temperature. Greater variations in coercivity may possibly cause some magnetic grains existing within one bit at positions near the boundary with another adjacent bit to have a different direction of magnetization from that pinned by the aforementioned recording operation. Thus, where the conditions of the recording operation are constant, greater variations in coercivity among the plurality of magnetic grains at the same temperature would possibly lead to a greater magnetic transition width. The magnetic transition width also depends on the conditions of recording operation. From these discussions, variations in coercivity at the same temperature among the plurality of magnetic grains affect the condition settings for the recording operation and the quality of the recording medium 10.

One of the causes for the aforementioned variations in coercivity may conceivably be variations in Curie temperature among the plurality of magnetic grains in the magnetic recording layer 14. That is, a difference in Curie temperature between two magnetic grains may lead to the difference in the coercivity at the same temperature between those two magnetic grains. Accordingly, variations in Curie temperature among a plurality of magnetic grains can also affect the condition settings for the recording operation of a magnetic recording apparatus and the quality of the recording medium. It would thus be advantageous to make it feasible to properly estimate not only the coercivity distribution of a plurality of magnetic grains but also the extent of variations in the Curie temperatures of the plurality of magnetic grains, i.e., the Curie temperature distribution of the plurality of magnetic grains. Such estimation results would be usable for condition settings for more appropriate recording operations, designing of the recording medium 10, quality control of the recording medium 10 during manufacturing, and so on.

Figure 1:
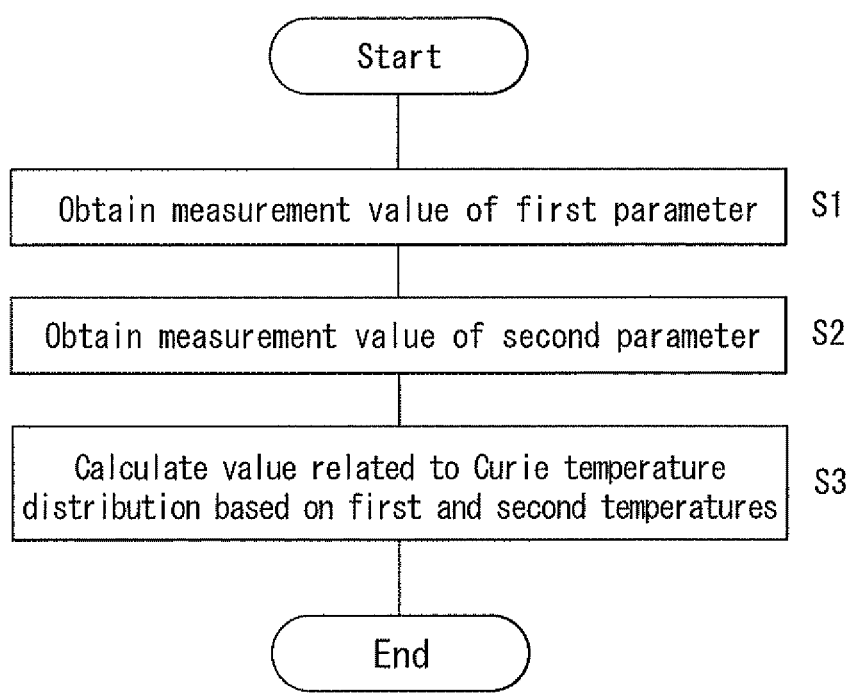
FIG. 1 is a flowchart showing an estimation method for the Curie temperature distribution in a magnetic recording layer according to an embodiment of the invention.

The estimation method according to the embodiment allows for estimating the Curie temperature distribution of the plurality of magnetic grains contained in the magnetic recording layer 14. The estimation method according to the embodiment will be described in detail below. FIG. 1 is a flowchart showing the estimation method according to the embodiment. As shown in FIG. 1, the estimation method according to the embodiment includes a first step S1, a second step S2, and a third step S3.

In the first step S1, a measurement value of a first parameter is obtained with the magnetic recording layer 14 used as the measurement subject, for each of different temperatures of the magnetic recording layer 14 by changing the temperature of the magnetic recording layer 14. The first parameter has such a property that the absolute value of the first parameter for each magnetic grain takes on the minimum value when the temperature of each magnetic grain reaches a predetermined temperature in the process of increasing the temperature of each magnetic grain. Here, the predetermined temperature varies according to the Curie temperature Tc of each magnetic grain in such a manner as to increase as the Curie temperature Tc increases, and to decrease as the Curie temperature Tc decreases.

In the second step S2, a measurement value of a second parameter is obtained with the magnetic recording layer 14 used as the measurement subject, for each of different temperatures of the magnetic recording layer 14 by changing the temperature of the magnetic recording layer 14. The second parameter is related to a value obtained by dividing the standard deviation of the coercivity distribution of the plurality of magnetic grains by the coercivity of the magnetic recording layer.

In the third step S3, a value related to the distribution of the Curie temperatures Tc of the plurality of magnetic grains is calculated based on a first temperature T1 and a second temperature T2. The first temperature T1 is the lowest temperature at which the absolute value of the measurement value of the first parameter obtained in the first step S1 takes on the minimum value. The second temperature T2 is the temperature of the magnetic recording layer 14 at which the value obtained by dividing the standard deviation of the coercivity distribution of the plurality of magnetic grains by the coercivity of the magnetic recording layer 14 takes on the maximum value. The second temperature T2 is obtained from the measurement value of the second parameter.

The step S2 may be executed before or after the step S1, or at the same time as the step S1.

Now, each step will be described in detail. To begin with, the step S1 will be explained. The first parameter is a parameter for estimating the Curie temperature of each magnetic grain. In the process of increasing the temperature of the magnetic grains, the spontaneous magnetization of the magnetic grains takes on the minimum value or zero when the temperature of the magnetic grains reaches the Curie temperature. What is required of the first parameter is such a property that when the temperature of each magnetic grain reaches a predetermined temperature in the process of increasing the temperature of each magnetic grain, the absolute value of the first parameter for each magnetic grain takes on the minimum value (for example, substantially 0), wherein the predetermined temperature varies according to the Curie temperature of each magnetic grain in such a manner as to increase as the Curie temperature increases, and to decrease as the Curie temperature decreases. Briefly speaking, this property is similar to that of the spontaneous magnetization which becomes zero when the Curie temperature is reached. The first parameter satisfying the aforementioned requirement makes it possible to estimate the Curie temperature of each magnetic grain. The first parameter may be related to the magnetization of each magnetic grain.

A ferromagnetic material will be saturated in magnetization as a magnetic field applied thereto is increased. The value of magnetization at this level is referred to as the saturation magnetization. When the temperature of a ferromagnetic material is increased to a certain temperature, the saturation magnetization becomes substantially zero. The temperature at which the saturation magnetization of a ferromagnetic material becomes substantially 0 in the process of increasing the temperature of the ferromagnetic material is substantially equal to the Curie temperature. In this context, the saturation magnetization can be employed as the first parameter. Note that when the temperature of a ferromagnetic material exceeds the Curie temperature, the magnetism of the ferromagnetic material changes to paramagnetism, so that the magnetization is no longer saturated and the saturation magnetization itself disappears.

In addition to the saturation magnetization, there also exist a number of parameters which become substantially 0 at the Curie temperature or at a temperature nearly equal thereto in the process of increasing the temperature of a ferromagnetic material. Such parameters include coercivity, nucleation field, saturation field, residual magnetization, saturation magnetic flux density, residual magnetic flux density, Kerr rotation angle, and anisotropy field. Accordingly, these parameters can also be employed as the first parameter. As will be described in more detail later, the saturation magnetization, coercivity, nucleation field, saturation field, residual magnetization, saturation magnetic flux density, residual magnetic flux density, Kerr rotation angle, and anisotropy field are all parameters that can be measured based on a hysteresis loop.

The first step S1 obtains a measurement value of the first parameter with the magnetic recording layer 14 used as the measurement subject, for each of different temperatures of the magnetic recording layer 14 by changing the temperature of the magnetic recording layer 14. In the first step S1, a hysteresis loop of the magnetic recording layer 14 may be determined for each temperature to obtain the measurement value of the first parameter based on the hysteresis loop. The hysteresis loop can be obtained by varying the magnitude of a magnetic field applied to the magnetic recording layer 14 and measuring the magnetization or a certain value related to the magnetization (for example, the magnetic flux density or the Kerr rotation angle) of the magnetic recording layer 14.

Figure 2:
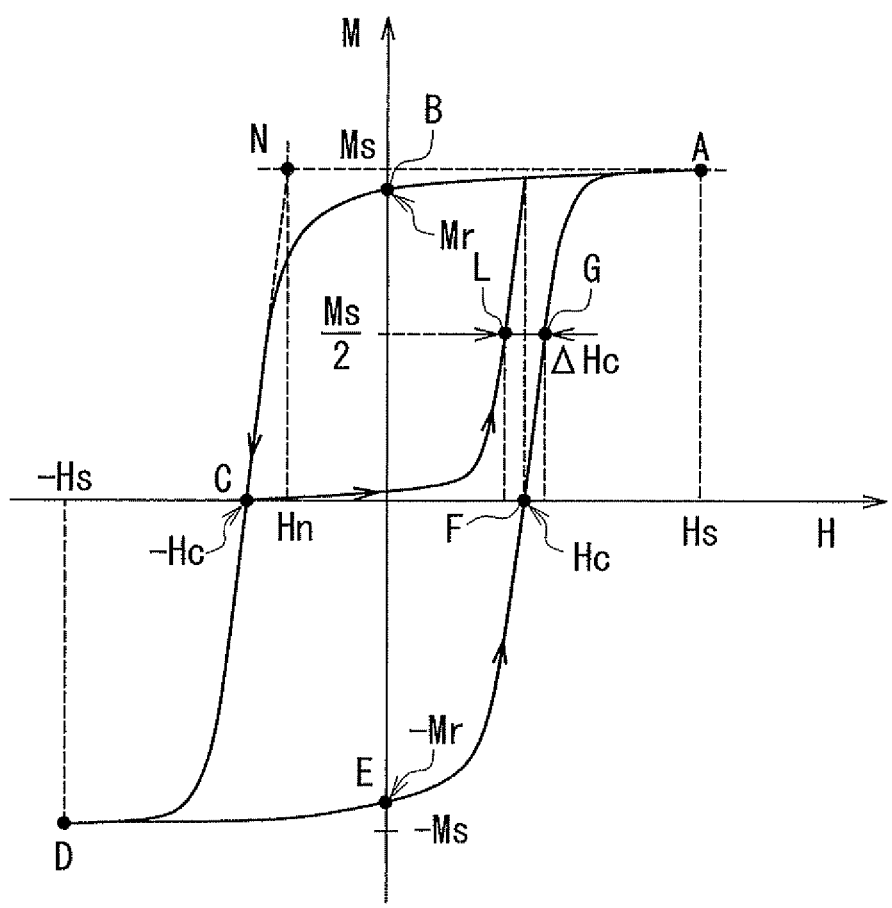
FIG. 2 is an explanatory diagram illustrating a hysteresis loop determined in the estimation method according to the embodiment of the invention.

Now, with reference to FIG. 2, a description will be made about a hysteresis loop (hereinafter referred to as the M-H hysteresis loop) that is obtained by measuring the magnetization M of the magnetic recording layer 14 while varying the magnitude of the magnetic field H applied to the magnetic recording layer 14, and about the parameter that can be measured based on the M-H hysteresis loop. FIG. 2 shows an example of the M-H hysteresis loop. In FIG. 2, the horizontal axis represents the magnetic field H applied to the magnetic recording layer 14, and the vertical axis represents the magnetization M of the magnetic recording layer 14. The magnetic field H and the magnetization M are oriented in the direction of the easy axis of magnetization of the magnetic grains, that is, in the direction of thickness of the magnetic recording layer 14.

As the magnetic field H is increased from 0, the magnetization M is saturated at Point A in FIG. 2. The magnitude of the magnetization M at Point A is the saturation magnetization Ms, while the magnitude of the magnetic field H at Point A is the saturation field Hs. As the magnetic field H is reduced from Point A, the magnetization M decreases via Points B and C and then reaches Point D. At Point B, the magnetic field H is zero. The magnitude of the magnetization M at Point B is the residual magnetization Mr. At Point C, the magnetization M becomes zero. The magnitude of the magnetic field H at Point C is −Hc, where Hc represents the coercivity to be described later. At Point D, the magnetization M becomes −Ms, while the magnetic field H becomes −Hs.

As the magnetic field H is increased from Point D, the magnetization M increases via Points E, F, and G to reach Point A. At Point E, the magnetic field H is zero. The magnitude of the magnetization M at Point E is −Mr. At Point F, the magnetization M is zero. The magnitude of the magnetic field at Point F is the coercivity Hc. At Point G, the magnitude of the magnetization M is Ms/2. The closed loop via Points A, B, C, D, E, F, G, and A described above is called the major loop.

As shown in FIG. 2, a point of intersection of the tangent to the major loop at Point C and a straight line that passes through Point A in parallel to the horizontal axis is assumed to be Point N. The magnitude of the magnetic field H at Point N is the nucleation field Hn.

All the aforementioned parameters obtainable based on the M-H hysteresis loop, i.e., the saturation magnetization Ms, the saturation field Hs, the residual magnetization Mr, the coercivity Hc, the nucleation field Hn, −Ms, −Hs, −Mr, and −Hc satisfy the requirement of the first parameter of the present invention. Accordingly, any of the aforementioned parameters can be employed as the first parameter. The absolute value of any of the aforementioned parameters of a ferromagnetic material takes on the minimum value (substantially 0) at a certain temperature as the temperature of the material is increased. The temperature at which the absolute value of the aforementioned parameters takes on the minimum value (substantially 0) is equal to or nearly equal to the Curie temperature, and varies according to the Curie temperature in such a manner as to increase as the Curie temperature increases, and to decrease as the Curie temperature decreases.

In place of the M-H hysteresis loop shown in FIG. 2, the first step S1 may alternatively determine a hysteresis loop (hereinafter referred to as the B-H hysteresis loop) that is obtained by measuring the magnetic flux density B of the magnetic recording layer 14 while varying the magnitude of the magnetic field H applied to the magnetic recording layer 14. Then, a measurement value of the first parameter may be obtained based on this B-H hysteresis loop. For the B-H hysteresis loop, the vertical axis represents the magnetic flux density B instead of the magnetization M. The B-H hysteresis loop can provide a plurality of parameters similar to those that can be obtained based on the M-H hysteresis loop, except that the value related to the magnitude of the magnetization M among the aforementioned plurality of parameters obtainable based on the M-H hysteresis loop is replaced with the value related to the magnitude of the magnetic flux density B. The saturation magnetic flux density can also be obtained as the first parameter in place of the saturation magnetization Ms. The residual magnetic flux density can also be obtained as the first parameter in place of the residual magnetization Mr. As such, the plurality of parameters obtainable based on the B-H hysteresis loop can also be employed as the first parameter.

Furthermore, in place of the M-H hysteresis loop shown in FIG. 2, the first step S1 may alternatively determine a hysteresis loop (hereinafter referred to as the $\theta_K$-H hysteresis loop) that is obtained by measuring the Kerr rotation angle $\theta_K$ of the magnetic recording layer 14 while varying the magnitude of the magnetic field H applied to the magnetic recording layer 14. Then, a measurement value of the first parameter may be obtained based on this $\theta_K$-H hysteresis loop. The Kerr rotation angle $\theta_K$ of the magnetic recording layer 14 can be obtained by irradiating the magnetic recording layer 14 with linear polarized light, detecting a beam of light reflected on the magnetic recording layer 14, and measuring the angle of rotation of the polarization plane of the reflected beam relative to the polarization plane of the incident beam. The Kerr rotation angle $\theta_K$ of the magnetic recording layer 14 depends on the magnitude of the magnetization of the magnetic recording layer 14. For the $\theta_K$-H hysteresis loop, the vertical axis represents the Kerr rotation angle $\theta_K$ instead of the magnetization M. The $\theta_K$-H hysteresis loop can provide a plurality of parameters similar to those that can be obtained based on the M-H hysteresis loop, except that the value related to the magnitude of the magnetization M among the aforementioned plurality of parameters obtainable based on the M-H hysteresis loop is replaced with the value related to the magnitude of the Kerr rotation angle $\theta_K$. As such, the plurality of parameters obtainable based on the $\theta_K$-H hysteresis loop can also be employed as the first parameter.

Furthermore, the anisotropy field Hk can also be employed as the first parameter. The anisotropy field Hk can be obtained by applying a magnetic field to the magnetic recording layer 14 in the direction of the hard axis of magnetization of the magnetic grains, i.e., in the in-plane direction of the magnetic recording layer 14 to determine the M-H hysteresis loop, and then measuring the magnitude of the magnetic field at which the magnetization of the magnetic recording layer 14 is saturated.

The M-H hysteresis loop and the B-H hysteresis loop can be measured using a vibrating sample magnetometer (VSM), for example. The $\theta_K$-H hysteresis loop can be measured using a Kerr effect measurement device.

Figure 3:
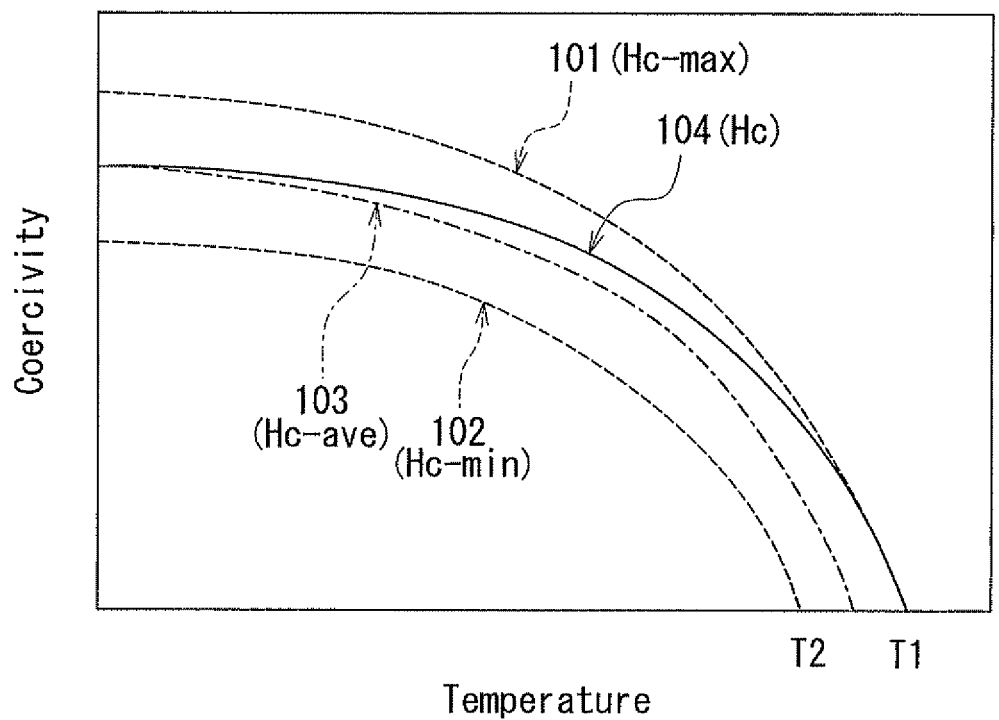
FIG. 3 is an explanatory diagram for explaining a first step of the estimation method according to the embodiment of the invention.

Now, with reference to FIG. 3, a description will be made as to the property of the measurement value of the first parameter where the Curie temperatures of the plurality of magnetic grains contained in the magnetic recording layer 14 have a distribution. Here, by way of example, a case will be described in which the coercivity is employed as the first parameter. In FIG. 3, the horizontal axis represents temperature, and the vertical axis represents coercivity. In FIG. 3, the curve denoted by reference numeral 101 shows the temperature dependence of the coercivity Hc-max of a magnetic grain having the highest Curie temperature in the Curie temperature distribution of the plurality of magnetic grains. The curve denoted by reference numeral 102 shows the temperature dependence of the coercivity Hc-min of a magnetic grain having the lowest Curie temperature in the Curie temperature distribution of the plurality of magnetic grains. The curve denoted by reference numeral 103 shows the temperature dependence of the coercivity Hc-ave of a magnetic grain having the middle Curie temperature in the Curie temperature distribution of the plurality of the magnetic grains. Furthermore, the curve denoted by reference numeral 104 shows the temperature dependence of the coercivity Hc of the magnetic recording layer 14 containing the plurality of magnetic grains, that is, the temperature dependence of the measurement value of the first parameter. Note that the curves denoted by the reference numerals 101 to 104 each schematically show the respective temperature dependences described above.

As shown in FIG. 3, the measurement value Hc of the first parameter (reference numeral 104) is equal or nearly equal to Hc-ave (reference numeral 103) at room temperatures. As the temperature increases, the coercivity of the magnetic grains decreases and accordingly, the measurement value Hc of the first parameter also decreases. In that process, the measurement value Hc of the first parameter approaches the coercivity Hc-max (reference numeral 101) of a magnetic grain having the highest Curie temperature. This is because as the coercivity of a plurality of magnetic grains decreases, the coercivity Hc of the magnetic recording layer 14 depends more greatly on a relatively higher coercivity in the coercivity distribution of the plurality of magnetic grains. Then, the measurement value Hc of the first parameter becomes substantially 0 for the first time when the coercivity Hc-max of the magnetic grain having the highest Curie temperature becomes substantially 0. The first temperature T1 is the lowest temperature at which the absolute value of the measurement value Hc of the first parameter takes on the minimum value, that is, becomes substantially 0. As can be seen from FIG. 3, the first temperature T1 is equal or nearly equal to the maximum value in the Curie temperature distribution of the plurality of magnetic grains. Based on the principle described above, it is possible to determine the first temperature T1 which is related to the maximum value in the Curie temperature distribution of the plurality of magnetic grains. Even when a parameter other than the coercivity Hc is employed as the first parameter, the aforementioned principle allows for determining the first temperature T1.

The second step S2 will now be described in detail below. In the second step S2, as mentioned previously, a measurement value of the second parameter is obtained with the magnetic recording layer 14 used as the measurement subject, for each of different temperatures of the magnetic recording layer 14 by changing the temperature of the magnetic recording layer 14. The second parameter is related to a value $\sigma$/Hc obtained by dividing the standard deviation $\sigma$ of the coercivity distribution of the plurality of magnetic grains contained in the magnetic recording layer 14 by the coercivity Hc of the magnetic recording layer 14. The second parameter may be $\sigma$/Hc itself, or alternatively may not be $\sigma$/Hc itself but have a certain relation (for example, a proportionality relation) with $\sigma$/Hc. By determining the temperature dependence of a parameter having a certain relationship with $\sigma$/Hc, the second temperature T2 at which $\sigma$/Hc takes on the maximum value can be found.

As the second parameter, the embodiment employs $\Delta$Hc/Hc described in Literature "TAGAWA and NAKAMURA". Here, $\Delta$Hc is proportional to $\sigma$. It therefore holds that $\Delta$Hc/Hc is proportional to $\sigma$/Hc.

Now, with reference to FIG. 2, how to determine $\Delta$Hc and $\Delta$Hc/Hc will be described. First, a minor curve is determined by increasing the magnetic field H from Point C on the M-H hysteresis loop shown in FIG. 2 to pass through Point L. At Point L on the minor curve, the magnitude of the magnetization M becomes Ms/2. Then, the difference between the magnitude of the magnetic field H at Point G on the major loop and the magnitude of the magnetic field H at Point L mentioned above is determined. This difference is $\Delta$Hc. $\Delta$Hc is a value related to the extent of the coercivity distribution of a plurality of magnetic grains. More specifically, as described in the aforementioned literature, $\Delta$Hc is equal to 1.35$\sigma$. Then, $\Delta$Hc/Hc is determined. Here, Hc is the coercivity of the magnetic recording layer 14 determined from the major loop. In this manner, $\Delta$Hc/Hc can be determined based on a hysteresis loop. Note that the hysteresis loop for determining $\Delta$Hc/Hc is not limited to the M-H hysteresis loop but may also be the B-H hysteresis loop or the $\theta_K$-H hysteresis loop.

In the second step S2, the hysteresis loop of the magnetic recording layer 14 is determined for each of different temperatures to obtain the measurement value of the second parameter $\Delta$Hc/Hc for each temperature based on the hysteresis loop. The second temperature T2, i.e., the temperature of the magnetic recording layer 14 at which $\sigma$/Hc takes on the maximum value, can be determined based on the measurement value of the second parameter $\Delta$Hc/Hc. That is, since $\Delta$Hc/Hc is proportional to $\sigma$/Hc, the temperature of the magnetic recording layer 14 at which $\sigma$/Hc takes on the maximum value is equal to the temperature of the magnetic recording layer 14 at which the measurement value of the second parameter $\Delta$Hc/Hc takes on the maximum value. Therefore, the second temperature T2 can be determined as the temperature of the magnetic recording layer 14 at which the measurement value of $\Delta$Hc/Hc takes on the maximum value.

Reference is now made to FIG. 3 to describe what is meant by the second temperature T2. As the temperature of the magnetic recording layer 14 increases to approach the temperature at which Hc-min shown by the reference numeral 102 in FIG. 3 becomes 0, $\Delta$Hc/Hc increases because Hc shown by the reference numeral 104 abruptly decreases while $\Delta$Hc does not vary so drastically. On the other hand, when the temperature of the magnetic recording layer 14 becomes equal to or higher than the temperature at which Hc-min becomes 0, there occurs an increase in the number of the magnetic grains whose coercivity becomes 0 with increasing temperature. This causes $\Delta$Hc to abruptly decrease. Thus, $\Delta$Hc/Hc takes on the maximum value at the temperature at which Hc-min becomes 0. The temperature at which Hc-min becomes 0 is equal or nearly equal to the lowest Curie temperature in the Curie temperature distribution of the plurality of magnetic grains. The second temperature T2 is the temperature of the magnetic recording layer 14 at which $\Delta$Hc/Hc takes on the maximum value, that is, the temperature at which Hc-min becomes 0. Accordingly, the second temperature T2 is equal or nearly equal to the lowest Curie temperature in the Curie temperature distribution of the plurality of magnetic grains.

As can be seen from the above descriptions, the first temperature T1 is related to the maximum value in the Curie temperature distribution of the plurality of magnetic grains. On the other hand, the second temperature T2 is related to the minimum value in the Curie temperature distribution of the plurality of magnetic grains. Therefore, it is possible in the third step S3 to calculate a value related to the Curie temperature distribution of the plurality of magnetic grains, more specifically, a value related to the extent of the Curie temperature distribution of the plurality of magnetic grains, based on the first temperature T1 and the second temperature T2. It is thought that T1−T2 is equal or nearly equal to the extent of the Curie temperature distribution of the plurality of magnetic grains. In this context, the value to be calculated in the step S3 can be related to T1−T2. Defining that T1−T2=$\Delta$Tc and (T1+T2)/2=Tca, the value to be calculated in the step S3 can be, for example, any one of $\Delta$Tc, $\Delta$Tc/2, $\Delta$Tc/Tca, and $\Delta$Tc/2Tca. Here, $\Delta$Tc relates to the extent of the Curie temperature distribution of the plurality of magnetic grains. In this manner, the estimation method according to the embodiment makes it possible to estimate the Curie temperature distribution of the plurality of magnetic grains contained in the magnetic recording layer 14 from the value calculated in the third step S3.

In the estimation method according to the embodiment, the entire magnetic recording layer 14, or alternatively a part of the magnetic recording layer 14 if the part contains a sufficient number of magnetic grains, may serve as the measurement subject. That is, if a part of the magnetic recording layer 14 to serve as the measurement subject contains a sufficient number of magnetic grains, the result of estimation of the part of the magnetic recording layer 14 can be considered to have a strong correlation with the result of estimation of the entire magnetic recording layer 14 and thus can be regarded as the result of estimation of the entire magnetic recording layer 14. Furthermore, the estimation method according to the embodiment does not necessarily require the use of the recording medium 10, and can use any sample different from the recording medium 10 but at least having the magnetic recording layer 14.

Figure 4:
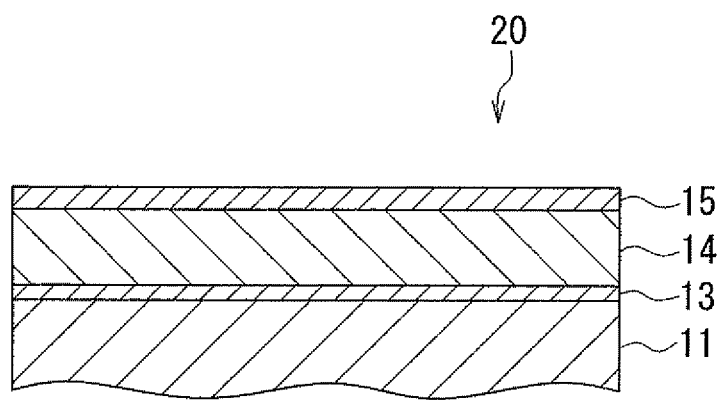
FIG. 4 is a cross-sectional view of a sample used in a practical example of the estimation method according to the embodiment of the invention.
Figure 5:
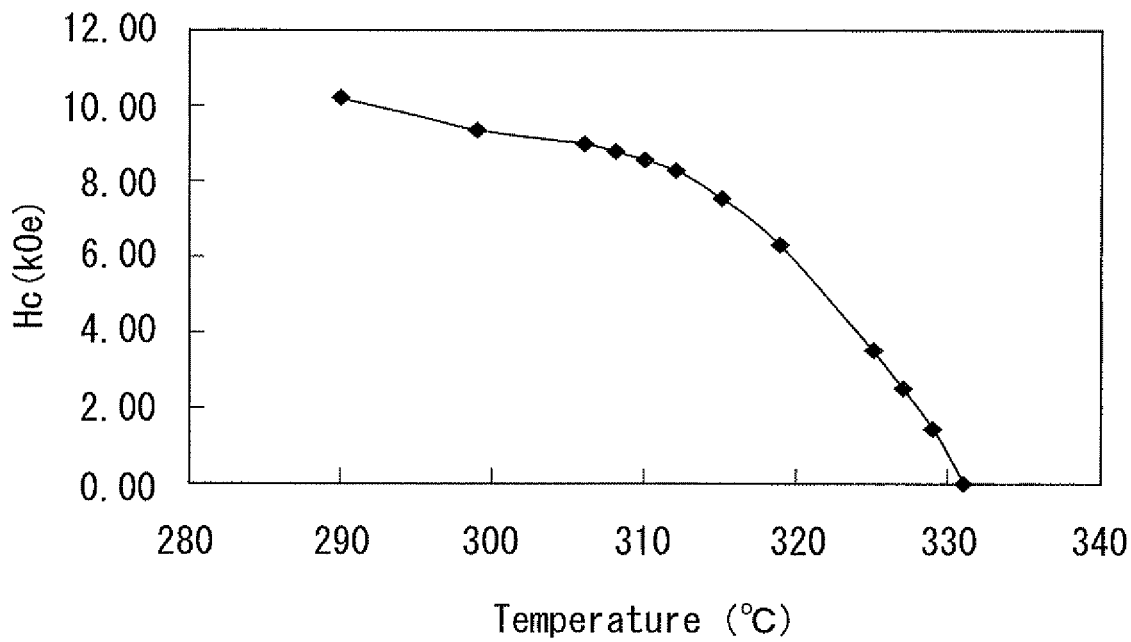
FIG. 5 is a characteristic chart showing measurement results obtained in the first step in the practical example.
Figure 6:
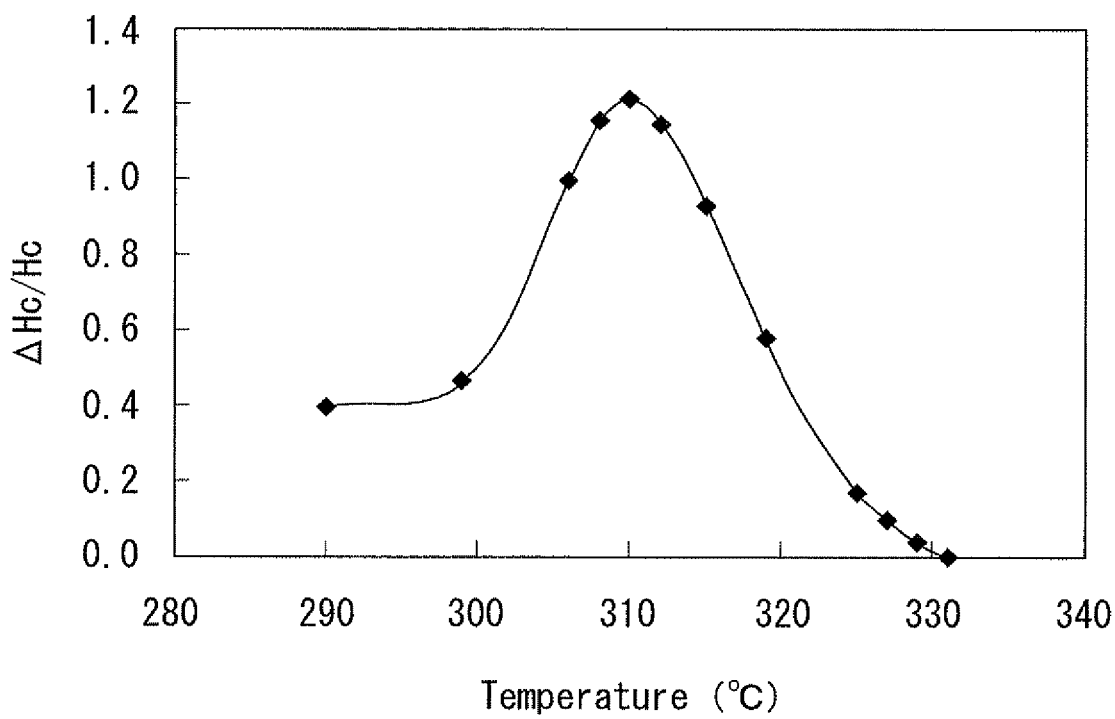
FIG. 6 is a characteristic chart showing measurement results obtained in a second step in the practical example.

Reference is now made to FIG. 4 to FIG. 6 to describe a practical example of the estimation method according to the embodiment. FIG. 4 is a cross-sectional view of a sample 20 used in the practical example. The sample 20 includes a substrate 11, and also an orientation layer 13, a magnetic recording layer 14 and a protection layer 15 which are stacked in this order on the substrate 11. The sample 20 is thus constructed such that the soft magnetic layer 12 is removed from the layers constituting the recording medium 10 shown in FIG. 8.

In the sample 20, the substrate 11 is made of glass and has a thickness of 0.6 mm. The orientation layer 13 is made of MgO and has a thickness of 2 nm. The magnetic recording layer 14 contains a plurality of magnetic grains made up of crystal grains of FePt or an ordered alloy having an $L1_0$ crystal structure, and a grain boundary portion made of $SiO_2$, a nonmagnetic material. The magnetic recording layer 14 has a thickness of 10 nm. The protection layer 15 is made of diamond-like carbon (DLC) and has a thickness of 3 nm.

The recording medium 10 corresponding to the sample 20 specifically has such a layer structure that the soft magnetic layer 12 is interposed between the substrate 11 and the orientation layer 13 in the aforementioned layer structure of the sample 20. For example, the soft magnetic layer 12 is made of NiFe alloy and has a thickness of 50 nm.

The sample 20 is square in shape with the sides of 1 cm, when viewed from in the direction perpendicular to the top surface of the protection layer 15.

In the practical example, the M-H hysteresis loop of the magnetic recording layer 14 of the sample 20 was determined using a VSM in the first step S1 and the second step S2. During these steps, a magnetic field H was applied to the magnetic recording layer 14 in the direction of the easy axis of magnetization of the magnetic grains, that is, in the direction of thickness of the magnetic recording layer 14, while the magnetic field H was varied in the range from −20 kOe to 20 kOe (1 Oe equals 79.6 A/m) at a rate of 60 Oe/second.

Suppose that a sample including the soft magnetic layer 12 in addition to the magnetic recording layer 14 is measured for its magnetic property using a VSM. In this case, since the soft magnetic layer 12 is thick, most of the magnetic property to be obtained depends on the soft magnetic layer 12, and thus it is difficult to measure the magnetic property of the magnetic recording layer 14. In view of this, the practical example uses the sample 20 including no soft magnetic layer 12. Using this sample 20, the magnetic property of the magnetic recording layer 14 was measured to determine the aforementioned M-H hysteresis loop.

Note that in the first step S1 and the second step S2, a Kerr effect magnetometer may also be used to determine the $\theta_K$-H hysteresis loop of the magnetic recording layer 14. In this case, the sample may include the soft magnetic layer 12.

The first step S1 of the practical example employed the coercivity Hc as the first parameter. Then, using the magnetic recording layer 14 as the measurement subject, a measurement value of the first parameter Hc was obtained for each of different temperatures of the magnetic recording layer 14 by changing the temperature of the magnetic recording layer 14. The measurement results obtained in the first step S1 are shown in Table 1 below and FIG. 5. In FIG. 5, the horizontal axis represents temperature (° C.), and the vertical axis represents Hc (kOe).

TABLE 1

| Temperature (° C.) | Hc (kOe) |
| --- | --- |
| 290 | 10.20 |
| 299 | 9.36 |
| 306 | 9.00 |
| 308 | 8.80 |
| 310 | 8.56 |
| 312 | 8.30 |
| 315 | 7.56 |
| 319 | 6.32 |
| 325 | 3.51 |
| 327 | 2.52 |
| 329 | 1.44 |
| 331 | 0.00 |

Then, based on the measurement results obtained in the first step S1, the first temperature T1, i.e., the lowest temperature at which the absolute value of the measurement value takes on the minimum value (0), was determined. T1 was determined to be 331° C.

In the second step S2 of the practical example, the hysteresis loop of the magnetic recording layer 14 was determined for each temperature to obtain the measurement values of ΔHc and ΔHc/Hc for each temperature based on the hysteresis loop. Table 2 below shows the measurement values of ΔHc and ΔHc/Hc obtained for each temperature in the second step S2. FIG. 6 also shows the measurement value of ΔHc/Hc for each temperature. In FIG. 6, the horizontal axis represents temperature (° C.), and the vertical axis represents ΔHc/Hc.

TABLE 2

| Temperature (° C.) | ΔHc | ΔHc/Hc |
| --- | --- | --- |
| 290 | 4.08 | 0.40 |
| 299 | 4.39 | 0.47 |
| 306 | 9.00 | 1.00 |
| 308 | 10.21 | 1.16 |
| 310 | 10.42 | 1.22 |
| 312 | 9.55 | 1.15 |
| 315 | 7.04 | 0.93 |
| 319 | 3.67 | 0.58 |
| 325 | 0.60 | 0.17 |
| 327 | 0.25 | 0.10 |
| 329 | 0.06 | 0.04 |
| 331 | 0.00 | 0.00 |

Then, based on the measurement results obtained in the second step S2, the second temperature T2, i.e., the temperature of the magnetic recording layer 14 at which a/Hc takes on the maximum value, was determined. The second temperature T2 is equal to the temperature of the magnetic recording layer 14 at which ΔHc/Hc takes on the maximum value, being 310° C. in the practical example.

In the third step S3 of the practical example, the first temperature T1 and the second temperature T2 were based to determine the value ΔTc/2 (ΔTc=T1−T2) which is related to the Curie temperature distribution of the magnetic grains. Here, ΔTc/2 is 10.5° C.

As described above, the estimation method according to the embodiment makes it possible to estimate the Curie temperature distribution of a plurality of magnetic grains contained in the magnetic recording layer 14. The result of estimation provided by the estimation method according to the embodiment can be utilized for condition settings for appropriate recording operations of magnetic recording apparatuses configured for thermally-assisted magnetic recording or can be utilized for quality control during the manufacture of the recording medium 10 intended for thermally-assisted magnetic recording.

The present invention is not limited to the foregoing embodiment, and various modifications may be made thereto. For example, the first and second parameters used in the present invention are not limited to those illustrated in the practical example, and may be any parameters so long as they satisfy the requirements stipulated in the appended claims.

It is apparent that the present invention can be carried out in various forms and modifications in the light of the aforementioned descriptions. Accordingly, within the scope of the following claims and equivalents thereof, the present invention can be carried out in forms other than the aforementioned most preferable embodiment.

What is claimed is:

1. A method of estimating a Curie temperature distribution of a plurality of magnetic grains contained in a magnetic recording layer, comprising:
   a first step of obtaining a measurement value of a first parameter with the magnetic recording layer used as a measurement subject, the measurement value being obtained for each of different temperatures of the magnetic recording layer by changing the temperature of the magnetic recording layer, the first parameter having such a property that an absolute value of the first parameter for each magnetic grain takes on a minimum value when the temperature of each magnetic grain reaches a predetermined temperature in the process of increasing the temperature of each magnetic grain, wherein the predetermined temperature varies according to the Curie temperature of each magnetic grain in such a manner as to increase as the Curie temperature increases, and to decrease as the Curie temperature decreases;
   a second step of obtaining a measurement value of a second parameter with the magnetic recording layer used as the measurement subject, the measurement value being obtained for each of different temperatures of the magnetic recording layer by changing the temperature of the magnetic recording layer, the second parameter being related to a value obtained by dividing a standard deviation of a coercivity distribution of the plurality of magnetic grains by the coercivity of the magnetic recording layer; and
   a third step of calculating a value related to the Curie temperature distribution of the plurality of magnetic grains based on a first temperature and a second temperature, the first temperature being the lowest temperature at which the absolute value of the measurement value of the first parameter takes on a minimum value, the second temperature being the temperature of the magnetic recording layer at which the value obtained by dividing the standard deviation of the coercivity distribution of the plurality of magnetic grains by the coercivity of the magnetic recording layer takes on a maximum value, the second temperature being obtained from the measurement value of the second parameter,
   wherein at least one of the first and second steps includes determining a hysteresis loop of the magnetic recording layer for each temperature with a vibrating sample magnetometer or a Kerr effect measurement device in order to obtain the measurement value of the first parameter or the measurement value of the second parameter.

2. The method according to claim 1, wherein the minimum of the absolute value of the measurement value of the first parameter is substantially zero.

* * * * *